(12) United States Patent
Stevens et al.

(10) Patent No.: US 7,294,995 B1
(45) Date of Patent: Nov. 13, 2007

(54) CURRENT PROBING SYSTEM

(75) Inventors: Kerry A. Stevens, Beaverton, OR (US); Michael J. Mende, Portland, OR (US); Jonathan S. Dandy, Beaverton, OR (US); Thomas J. Sharp, Tigard, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 11/430,385

(22) Filed: May 8, 2006

(51) Int. Cl.
*G01R 31/02* (2006.01)

(52) U.S. Cl. .................................... 324/72.5
(58) Field of Classification Search ............... 324/73.1, 324/72.5, 117 R, 117 H
See application file for complete search history.

(56) References Cited

U.S. PATENT DOCUMENTS

| | | | |
|---|---|---|---|
| 3,525,041 A | 8/1970 | Velsink | |
| 4,034,291 A * | 7/1977 | Allen et al. | ............. 324/121 R |
| 4,438,395 A * | 3/1984 | McClenahan | ............... 324/127 |
| 5,477,135 A | 12/1995 | Baker | |
| 5,493,211 A | 2/1996 | Baker | |
| 6,466,000 B1 | 10/2002 | Nightingale | |
| 6,603,297 B1 | 8/2003 | Gessford et al. | |
| 6,704,670 B2 | 3/2004 | McTigue | |
| 6,885,183 B2 | 4/2005 | Kato | |
| 2004/0204875 A1 * | 10/2004 | Kopken | ....................... 702/64 |

* cited by examiner

*Primary Examiner*—Vincent Q. Nguyen
(74) *Attorney, Agent, or Firm*—William K. Bucher

(57) ABSTRACT

A current probing system has a current probe and a detachable adapter. The current probe has a probe body with electrically conductive contacts that mate with electrically conductive contacts on the adapter. Leads extend from the adapter for coupling to a current carrying conductor. The leads can connect to a plug that is coupled to a current diverting device for coupling a current signal to the current probe. The adapter may also include a switch that selectively couples the current signal to the current probe when the adapter is mated with the current probe. The contacts of the current probe are coupled to a current sensing circuit which generates a voltage output representative of the current signal. The voltage output is coupled to an oscilloscope via an electrical cable.

13 Claims, 7 Drawing Sheets

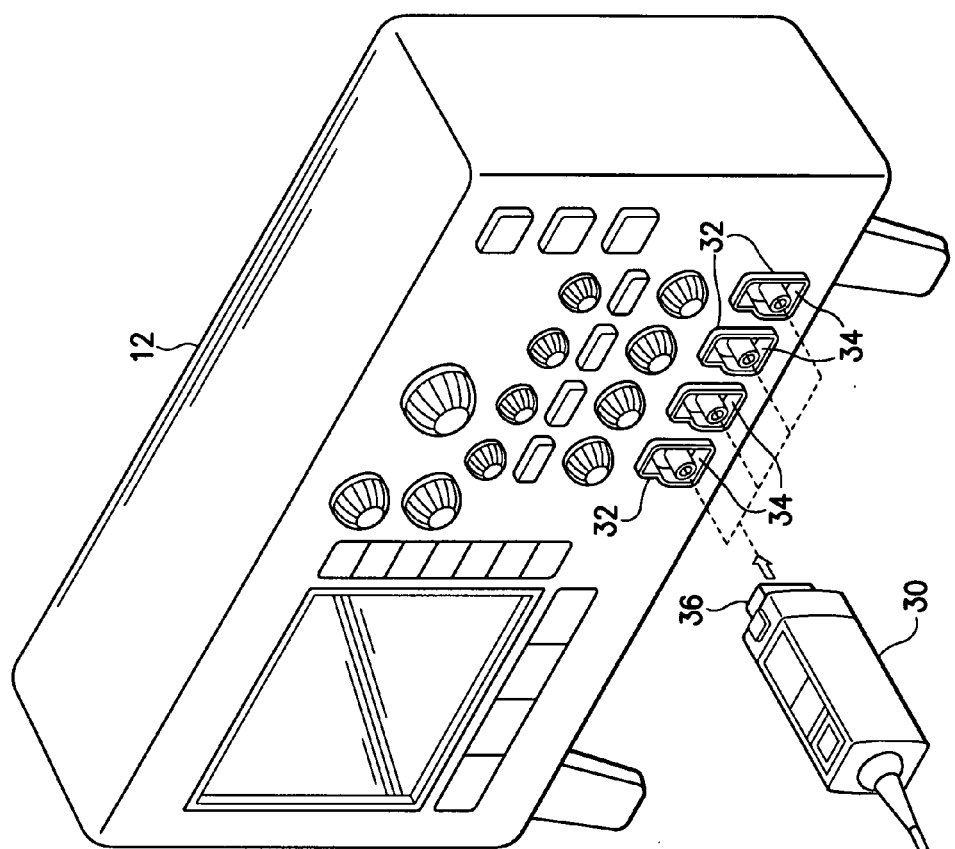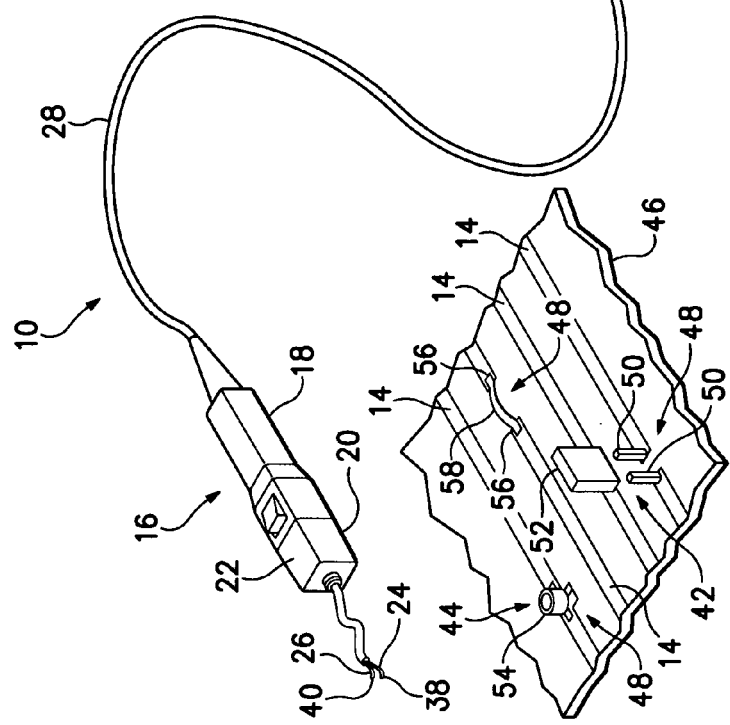

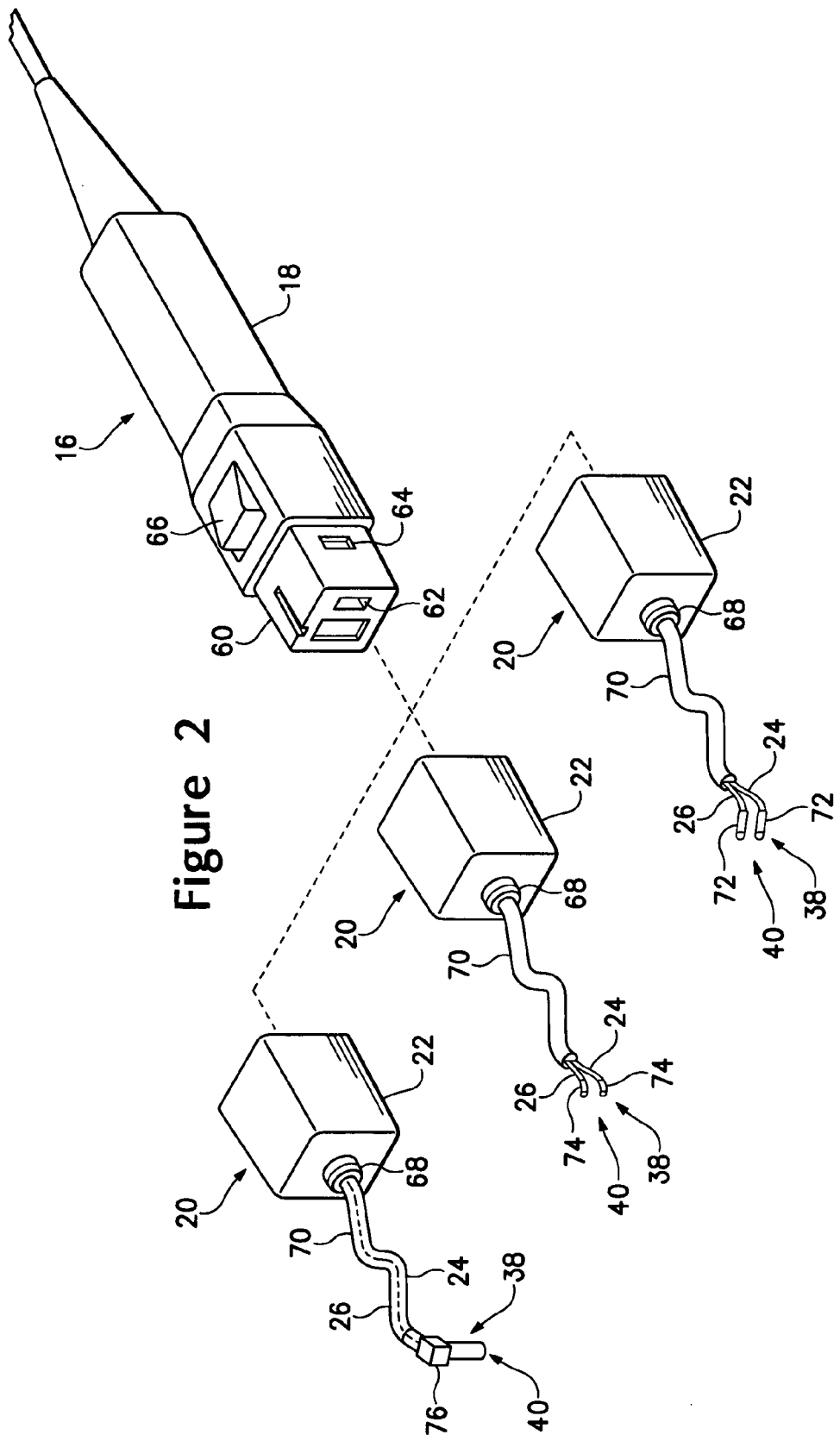

CURRENT PROBING SYSTEM

BACKGROUND OF THE INVENTION

The present invention relates generally to current probes and more particularly to a current probe system for use with an oscilloscope for acquiring a current signal from a current carrying conductor.

Current probes used with oscilloscopes apply transformer technology to measure current flowing in a conductor. The transformer has a ring-shaped magnetic core defining an aperture and may be solid or closed core or an open or split core where one side of the magnetic core is movable relative to the other sides. This allows the current carrying conductor to be passed through the aperture of the transformer without having to disconnect the current carrying conductor from a circuit. The current carrying conductor is passed through the aperture in the magnetic core and acts as the primary winding of the transformer. A secondary winding is wrapped around one side of the magnetic core. The current flowing in the current carrying conductor induces a magnetic flux that is linked to the magnetic core and the secondary winding. The magnetic flux causes a current to be generated in the secondary winding that produces a magnetic flux that is opposite to that generated by the current flowing in the current carrying conductor. In a passive current probe, the alternating current generated by the secondary winding is dropped across a transformer termination resistor which generates an AC voltage output. The voltage output is coupled via an electrical cable to an input channel of the oscilloscope. The oscilloscope processes the voltage signal for displaying a representation of the current signal.

Since transformers are AC signal coupling devices, the passband of the transformer cut-off frequency is above the DC level. To allow the current probe to sense DC and low frequency current signals, an active current probe includes a Hall effect device in the magnetic core of the transformer. The Hall effect device is a semi-conductor positioned in the magnetic core such that the magnetic flux in the magnetic core is substantially perpendicular to the Hall plate. A bias is applied to the Hall plate and the resulting voltage generated by the Hall effect due to the flux in the magnetic core is coupled to the input of a differential amplifier. The single ended output of the amplifier may be coupled to a power amplifier which generates a current output proportional to the current generated by the Hall effect device. The output of the Hall device amplifier or alternately the power amplifier is coupled to the secondary winding of the transformer such that the output current from the amplifier flowing through the secondary winding produces a flux that opposes the input magnetic flux over the frequency passband of the Hall effect device. In one implementation, the output of the Hall effect or power amplifier is coupled to one side of the secondary winding with the other side of the winding coupled to the transformer termination resistor and amplifier circuitry. In another implementation, the output of the Hall effect amplifier is coupled via a resistor to the same side of the secondary as the amplifier circuitry. A capacitor is coupled to the input of a wideband amplifier in the amplifier circuitry for blocking the current from the Hall effect amplifier. The output of the Hall effect amplifier and the output of the wideband amplifier are summed at the input of a operational amplifier having a feedback resistor that provides a voltage output proportional to the combined current in the secondary winding of the transformer. The voltage output of the operational amplifier is a measure of the AC and DC components of the magnetic core flux. The output of the operational amplifier is coupled via an electrical cable to an input channel of the oscilloscope. Generally, active current probes are of the split-ring transformer type. U.S. Pat. Nos. 3,525,041, 5,477,135 and 5,493,211 describe the above current sensing circuits.

To measure the current passing through a conductor, the current probe must be coupled in series with the conductor. This proves difficult when the current carrying conductor is fixed to a substrate, such as a circuit trace on a circuit board. The general procedure for measuring the current in a current trace is to break the trace and solder a length of wire between the trace break. The wire is passed through the aperture in the transformer of the current probe where the wire acts as the primary winding of the transformer. Another procedure is to manufacture the circuit board with gaps in the traces and install square pins on either side of the gaps. A conductive jumper is coupled to the square pins during normal testing of the circuit board. When a current measurement is required the jumper is removed and a length of wire is connected between the square pins. As before, the wire is used as the primary winding of the transformer in the current probe.

Transformer based current probes have a number of limitations in measuring currents through circuit traces on a circuit board. The sensitivity and accuracy of the resulting current measurement is limited by the repeatability of placing the wire in the same position within the magnetic core of the transformer and the repeatability of the split core being exactly aligned in the same position when it is opened and closed. What is needed is a current probing system that eliminates the use of a loop of wire as the primary winding of a current probe. Additionally, the current probing system should provide flexibility in connecting the current probe to the current carrying conductor. Further, the current probing system should provide greater repeatability in the sensitivity and accuracy of the current measurement.

SUMMARY OF THE INVENTION

Accordingly, a current probing system for use with an oscilloscope for acquiring a current signal from a current carrying conductor that meets the above described needs has a current probe and an adapter mountable on the current probe. The current probe has a probe body and first and second electrically conductive contacts disposed in one end of the probe body. The first and second electrically conductive contacts are adapted for coupling in series with the current carrying conductor. The first and second electrically conductive contacts are coupled to a current sensing circuit for generating an output signal representative of the current flowing in the current carrying conductor. The output signal from the current sensing circuit is coupled to the oscilloscope via an electrically conductive cable extending from the other end of the probe body. An adapter has a housing adapted for mounting on the probe body and has first and second electrically conductive leads extending from the housing. Each of the leads has a first electrical contact for coupling to the current carrying conductor and a second electrical contact disposed within the housing for coupling with one of the first and second electrically conductive contacts of the current probe.

The first electrical contacts of the first and second electrically conductive leads may be coupled to a plug adapted for engaging electrically conductive contacts acting as switch elements in a current diverting device electrically coupled to the current carrying conductor. The current diverting device couples the current signal through the current carrying conductor in a first position and couples the current signal through the current probe in a second position resulting from downward pressure of the plug on at least one of the electrically conductive contacts of the current diverting device. The downward pressure causes the electrically conductive contacts of the current diverting device to disengage in a second current diverting device position.

Each of the first electrical contacts of the electrically conductive leads may also be formed of an electrically conductive sockets having a bore therein for mating with square pin connectors mounted on either side of a non-conductive gap in the current carrying conductor. Each of the first electrical contacts of the first and second electrically conductive leads may further be formed as a contact pad that are fixedly secured to the current carrying conductor on either side of the non-conductive gap. Where the leads of the adapter are coupled across a non-conductive gap in the current carrying conductor, a switch disposed within the adapter housing having a first terminal electrically coupled to one electrically conductive leads and selectively coupled to one of the current probe contacts and a second terminal coupled to the other electrically conductive lead and selectively coupled to the other current probe contact. A switch armature selectively couples the first and second terminals together. The switch has a first position where the switch armature electrically couple the electrically conductive leads together when the adapter housing is separated from the probe body and a second position where the switch armature de-couples the leads from each other when the adapter housing is mounted on the probe body. The current probe contacts are electrically coupled to the first and second terminals of the switch when the adapter housing is mounted on the probe body. The adapter may also include first and second voltage clamps, preferably in the form of diodes, disposed between the first and second terminals of the switch for minimizing arcing across the contact terminal caused by inductive kick-back.

In the preferred embodiment, the electrically conductive contacts disposed in the probe body and the adapter housing are formed from an array of contact disposed in respective receptacles. Each receptacle has a first and second portions of the array of contacts electrically coupled together to form the first and second electrically conductive contact in the probe body and the first and second electrically conductive contacts in the adapter housing. The receptacles in the probe body and adapter housing mate together for coupling the first and second electrically conductive contacts in the probe body with the first and second electrically conductive contacts in the adapter housing.

The current sensing circuit may be implemented as a magnetic sensor coupled to the first and second electrically conductive contacts for sensing the magnetic flux of the current signal and coupled to amplifier circuitry for generating the output signal representative of the current flowing in the current carrying conductor. The magnetic sensor may take the form of a transformer or a flux gate. The transformer has a magnetic core with primary and secondary windings wrapped around the magnetic core. The primary winding is coupled to the first and second electrically conductive contacts for receiving the current signal from the current carry conductor and induces a magnetic flux within the magnetic core and the secondary winding for generating a current signal output in the secondary winding that is coupled to amplifier circuitry. The transformer may further include a magneto-electric converter disposed in the magnetic core that interacts with the magnetic flux within the magnetic core for generating a voltage signal representative of DC to low frequency current signals on the current carrying conductor with the voltage signal being coupled to the amplifier circuitry.

The objects, advantages and novel features of the present invention are apparent from the following detailed description when read in conjunction with appended claims and attached drawings.

BRIEF DESCRIPTION OF THE DRAWINGS

FIG. 1 is a perspective view of the current probing system according to the present invention.

FIG. 2 illustrates various adapters for the current probing system.

DETAILED DESCRIPTION OF THE INVENTION

Figure 3:
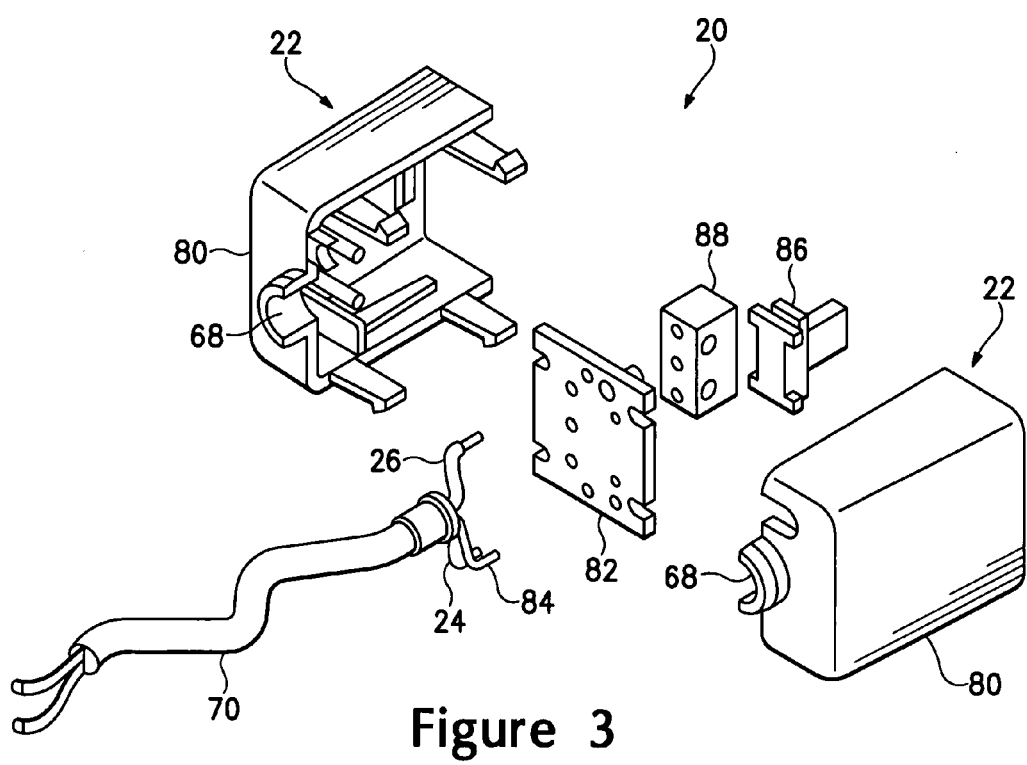
FIG. 3 is an exploded perspective view of the adapter for the current probing system.

FIG. 1 is a perspective view of current probing system 10 for use with an oscilloscope 12 for acquiring a current signal from a current carrying conductor 14. The current probing system 10 has a current probe 16 having a probe body 18 in which is disposed a current sensing circuit. The current sensing circuit is electrically coupled to first and second electrically conductive contacts disposed in one end of the probe body 18. An adapter 20 is selectively attached to the probe body 16. The adapter 20 has a housing 22 from which extends first and second electrically conductive leads 24 and 26. Extending from the other end of the probe body 18 is a conductive cable 28 for coupling an output signal from the current sensing circuit to the oscilloscope 12 and providing electrical power to the current probe 16. The conductive cable 28 is preferably coupled to a current probe control box 30 that is coupled to one of a number of input signal channel 32 of the oscilloscope 12. Each input signal channels 32 has a receptacle interface 34 with each interface having electrically conductive contacts and a coaxial signal jack. The current probe control box 30 has an plug interface 36 that mates with the receptacle interfaces 34 and has electrical contacts and a coaxial signal jack that interface with the corresponding electrical contacts and coaxial signal jack in receptacle interfaces 34. The interfaces 34 and 36 provide electrical power to the current probe 16 as well as providing communications between the current probe 16 and the oscilloscope 12. The interfaces 34 and 36 also provide a signal path between the current probe 16 and the oscilloscope 12.

Various types of electrical contacts 38, 40 are provided on the first and second electrically conductive leads 24 and 26 of the current probe adapter 20 which will be described in greater detail below. The electrical contacts are adapted for electrically coupling to one of a number of electrical connectors 42, 44 mounted on a current carrying conductor 14, such as a circuit trace formed on a circuit board 46 or the like. The electrical connectors 42, 44 are positioned on the current carrying conductor 14 across a non-conductive gap 48 in the current carrying conductor 14. The electrical connector 42 has square pins 50 mounted on either side of the non-conductive gap 48 which are electrically coupled to the current carrying conductor 14. An electrical jumper 52 is positioned in the square pins 50 for coupling the current signal across the non-conductive gap 48 when the current probe adapter 20 is not coupled into the current carrying conductor 14. The electrical connector 44 is a coaxial receptacle 54 mating with a coaxial plug to be described in greater detail below. Contacts pads 56 may also be formed on the current carrying conductor 14 on either side of the non-conductive gap 48. A removable electrical conductive foil 58 is secured to the contact pads for coupling the current signal across the non-conductive gap 48. The electrically conductive foil 58 is removed from the current carrying conductor 14 when the current probe adapter 20 is coupled to the current carrying conductor 14.

FIG. 2 shows representative examples of the adapters 20 for the current probing system 10. The probe body 18 of the current probe 16 has a substantially rectangular shaped front section 60 that is recessed from the outer surface of the probe body 18. In the preferred embodiment, the front section 60 has a receptacle 62 having an array of contacts forming the first and second electrically conductive contacts of the current probe 16. One portion of the array of contacts forms the first electrically conductive contact and the other portion of the array of contacts forms the second electrically conductive contact. The adapter housing 22 mates with and is secured to the front section 60 of the probe body 18 via latching elements 64 disposed on the extending front portion 60. A release lever 66 is positioned on the probe body 18 that when moved from a first to a second position disengages the latching elements 64 from the adapter housing 22.

The housing 22 of the adapter 20 has an aperture 68 from which extend a cable 70 containing the first and second electrically conductive leads 24 and 26. One end of each of the electrically conductive leads 24 and 26 are configured with electrical contacts 38, 40 for electrically coupling to the current carrying conductors 14 via one of the electrical connectors 42, 44 or the contact pads 56 on the current carrying conductor 14. In one configuration, the electrical connectors are electrically conductive sockets 72 attached to the electrically conductive leads 24, 26. The electrically conductive sockets 72 mate with the square pins 50 on either side of the non-conductive gap 48 in the current carrying conductor 14. In another configuration, the electrical contacts 38, 40 are electrically conductive wires 74 extending from end of the electrically conductive leads 24, 26. The electrically conductive wires 74 may be the ends of the leads or they may be formed as contact pads for securing to the contact pads 56 of the current carrying conductor 14 on either side of the non-conductive gap 48. In still a further configuration, the electrically conductive leads 24, 26 are electrically coupled to a coaxial plug 76 that mates with the coaxial receptacle 54 mounted over the non-conductive gap 48 in the current carrying conductor 14.

Referring to FIG. 3, there is shown an exploded perspective view of the adapter 20. The adapter housing 22 is preferably formed of housing halves 80 that are mated together to capture a circuit board 82 therein. Extending through the aperture 68 in the adapter housing 22 is the cable 70 containing the first and second electrically conductive leads 24, 26. The electrically conductive leads 24, 26 are electrically coupled to the circuit board 82. A ground lead 84 also extends from the cable 70 and is connected to an outer shielding conductor. A receptacle 86 is mounted on the circuit board 82 that has an array of contacts similar to the array of contacts in the receptacle 62 in the probe body 18. The receptacles 62 and 86 are mating devices where the array of contacts in one receptacle 62 mates with the array of contacts in the other receptacle 86. A switch 88 is also mounted on the circuit board 82. The switch 88 is used with the adapters 20 having the contact pads 74 and electrically conductive sockets 72. The electrically conductive leads 24, 26, the receptacle 86 and the switch 88 are electrically coupled together through circuit traces on the circuit board 82 as best shown by the schematic representation of FIG. 4.

Figure 4:
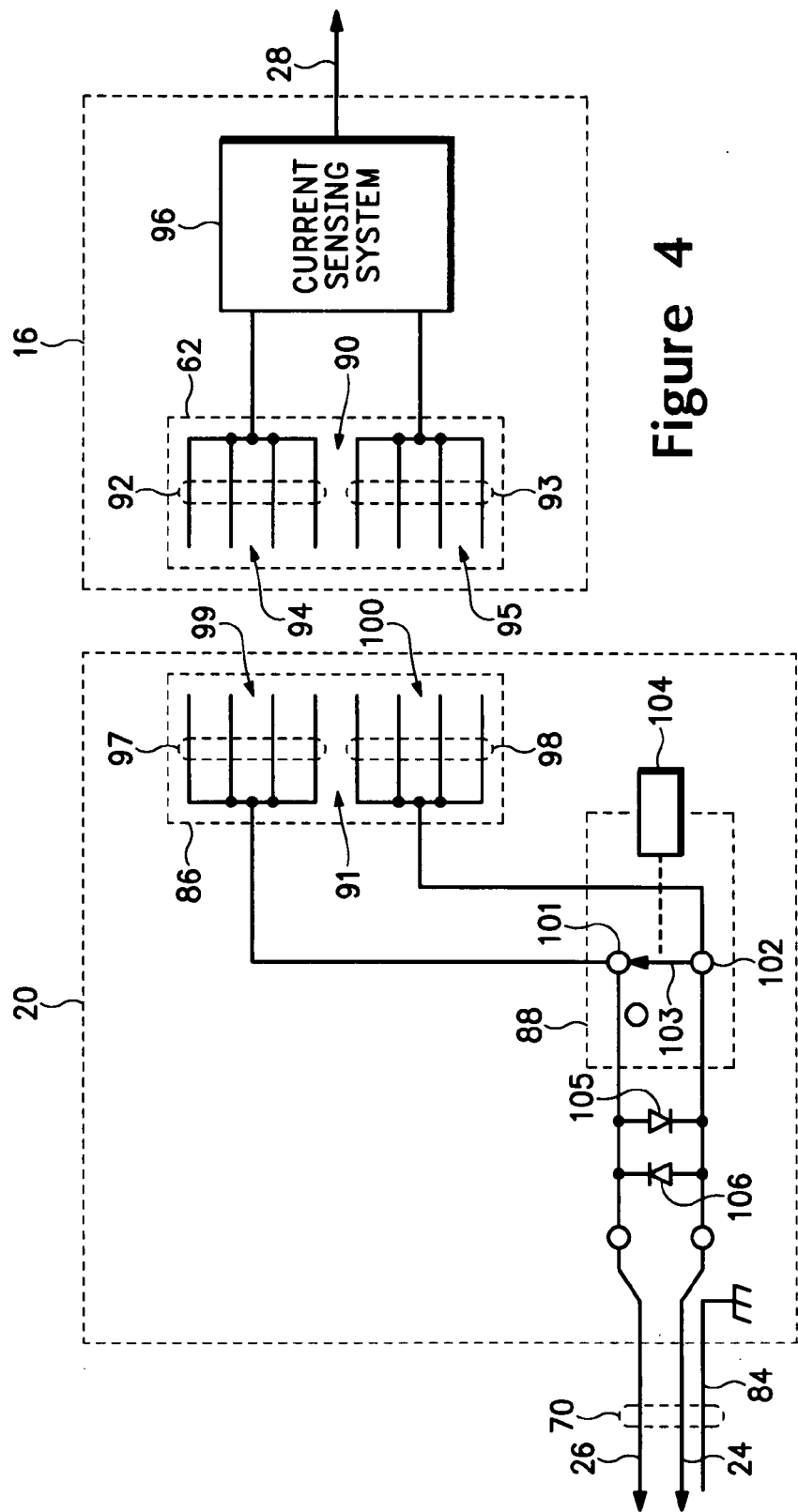
FIG. 4 is a schematic representation of the circuitry in the adapter for the current probing system.

In the schematic of FIG. 4, the receptacles 62 and 86 show the respective array of contact 90 and 91. First and second portions 92 and 93 of the array of contacts 90 are ganged together to form the first and second electrically conductive contacts 94 and 95 of the current probe 16 that are coupled to the current sensing circuit 96. First and second portions 97 and 98 of the array of contacts 91 are ganged together to form the first and second electrically conductive contacts 99 and 100 of the adapter 20. The first electrically conductive contact 99 is electrically coupled to a first terminal 101 of switch 88 and the second electrically conductive contact 100 is electrically coupled to a second terminal 102 of the switch 88. The first electrically conductive lead 24 is also electrically coupled to switch terminal 102 and the second electrically conductive lead 26 is electrically coupled to switch terminal 101. A switch armature 103 is electrically coupled to switch terminal 102 and selectively coupled to switch terminal 101. The switch armature 103 is mechanically coupled to a plunger 104 extending from the switch 88. Clamping diodes 105 and 106 are electrically coupled across the switch terminals 101 and 102.

The switch armature 103 couples the switch contacts 101 and 102 together when the adapter 20 is not connected to the current probe body 18. The resulting electrical switch connection couples the first and second electrically conductive leads 24 and 26 together. This provides a current path across the non-conductive gap 48 in the current carrying conductor 14 when the adapter 20 to be connected to the current carrying conductor 14. Mating the adapter 20 with the current probe body 18 first brings the array of contacts 90 and 91 of the receptacles 62 and 82 into electrical contact. Continued insertion of the adapter 20 onto the probe body 18 brings the switch plunger 104 into contact of the probe body 18. Continued insertion of the adapter 20 onto the probe body 18 depresses the plunger 104 causing the switch armature 103 to disengage from the switch contact 101. This opens the short across the switch contacts 100 and 101 and couples the current carrying conductor 14 in series with the current sensing circuit 96 via the electrically conductive leads 24 and 26. The configuration of the switch 88 and the receptacle 86 on the circuit board 82 provides for a make before break contact of the array of contacts 90 and 91 of the receptacles 86 and 62 prior to the switch armature 103 breaking contact with the switch terminal 101. The clamping diodes 105 and 106 mounted on the circuit board 82 are provided for minimizing arcing across the switch terminal 101 and contact terminal 10 caused by inductive kick-back.

Figure 5:
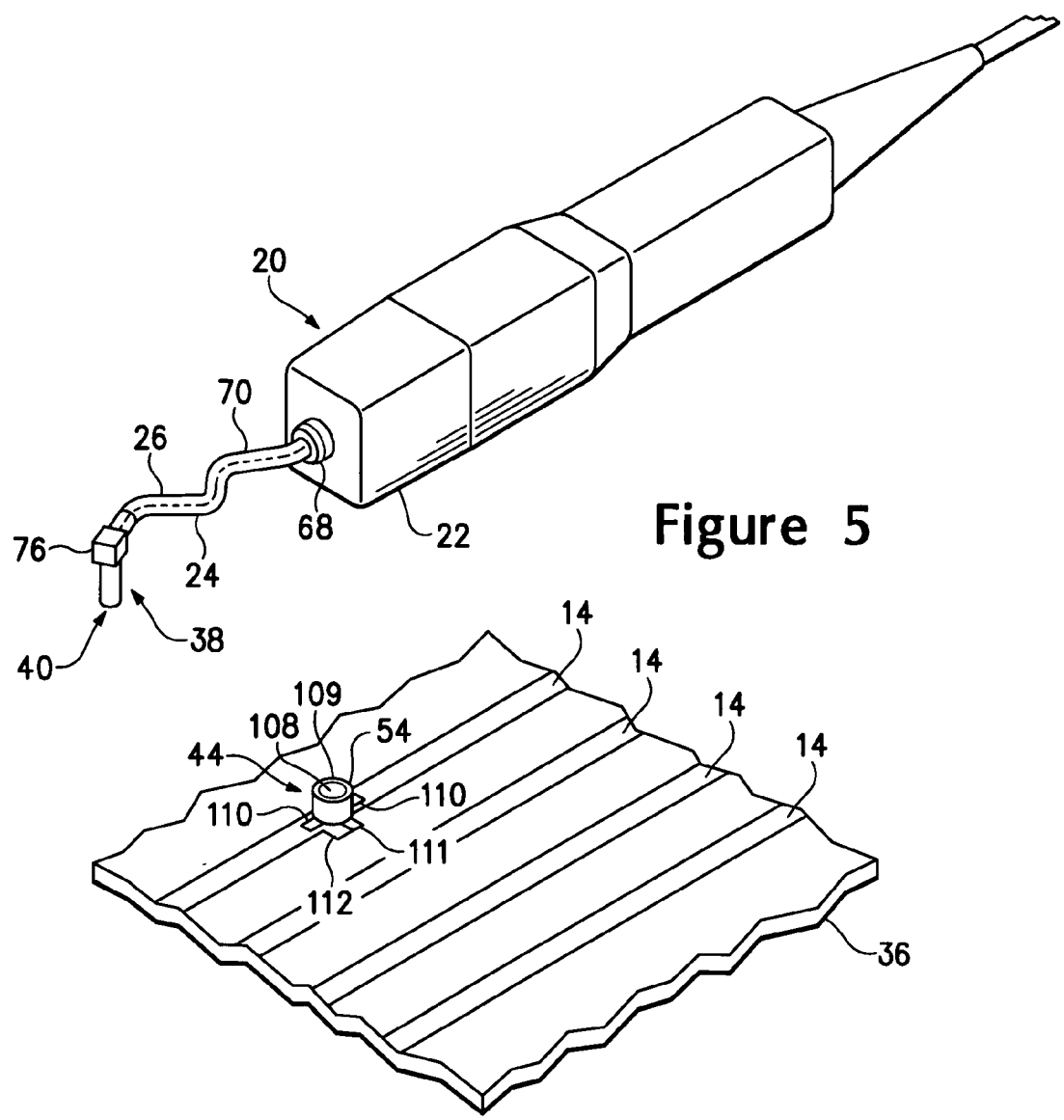
FIG. 5 is a perspective view of the adapter usable with a current diverting device mounted on a current carrying conductor.

FIG. 5 is a perspective view of adapter 20 with the electrically conductive leads electrically coupled to the coaxial plug 76. One of the electrically conductive leads 24, 26 is electrically coupled to a center electrical conductor in the coaxial plug 76 and the other lead electrically is coupled to the electrically conductive outer body of the plug 76. The center electrical conductor and the electrically conductive outer body of the coaxial plug 76 are insulated from each other. The electrical connector 44 is a current diverting device having a coaxial receptacle 54 with a central bore 108 insulated from an outer electrically conductive sleeve 109. Extend in opposite direction from the coaxial receptacle are electrically conductive contacts 110 that are fixedly secured to the current carrying conductor 14 on either side of the non-conductive gap 48 using solder, electrically conductive adhesive or the like. The electrically conductive contacts 110 extend into the coaxial receptacle 54 with one of the electrically conductive contacts extending across the central bore 108 to overlap the other electrically conductive contact 110 to act as switch elements. One of the electrically conductive contacts 110 is electrically coupled to the electrically conductive sleeve 109 via electrically conductive leads 111 extending from the coaxial receptacle 54 in a direction perpendicular to the other electrically conductive contacts 110 and electrically coupled to the current carrying conductor 14 on the other side of the non-conductive gap 48 via contact pads 112 formed on the circuit board 46. The electrically conductive contacts 110 couple the current signal across the non-conductive gap 48 in the current carrying conductor 14 in the first current diverting device position.

The coaxial plug 76 is secured to the coaxial receptacle 54 with the electrically conductive outer body of the coaxial plug 76 electrically coupled to the outer electrically conductive sleeve 109 of the coaxial receptacle 54. The central electrical conductor of the coaxial plug 76 extends into the central bore 108 of the coaxial receptacle 54 and engages the electrically conductive contact 110 extending into the bore 108. The central electrical conductor of the coaxial plug 76 exerts downward pressure on the electrically conductive contact 110 causing the contact 110 to disengage from the other electrically conductive contact 110. The current signal is diverted from the current carrying conductor 14 through the current sensing circuit of the current probe 16 and back to the current carrying conductor 14 via one of the electrically conductive contacts 110 coupled to the central conductor of the coaxial plug 76 and to the current probe 16 via one of the electrically conductive leads 24, 26 and the other electrically conductive contact 110 coupled to the outer electrically conductive sleeve 109 of the coaxial receptacle 54 and the electrically conductive outer body of the coaxial plug 76 and to the current probe 16 via the other of the electrically conductive leads 24, 26. The mating of the coaxial plug 76 with the coaxial receptacle 54 couples the current probe 16 in series with the current carrying conductor 14 and is the second current diverting device position. Removal of the coaxial plug 76 from the current diverting device 54 releases the downward pressure on the electrically conducive contact 110 which causes the contacts 110 to re-engage each other. The above described coaxial receptacle 54 and mating coaxial plug 76 are manufactured and sold by Amphenol, Corp., Wallingford, Conn., as a RF-Switch and RF-Probe under respective Part Nos. MCH-201 and MCH203.

Figure 6:
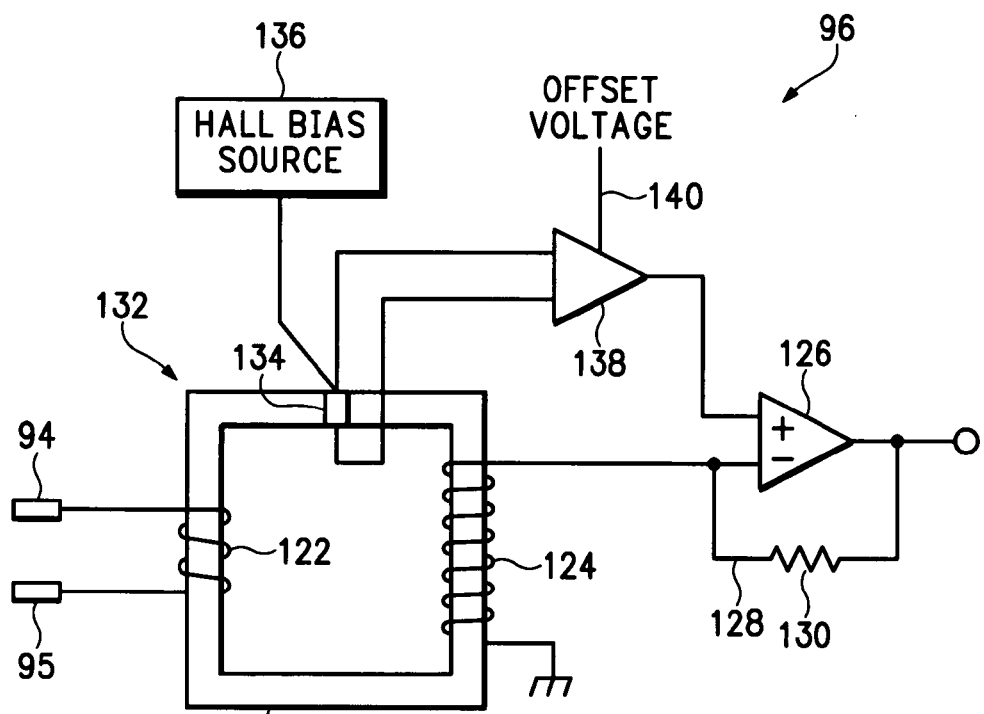
FIG. 6 is a schematic representation of a current sensing circuit in the current probing system.

Referring to FIG. 6, there is shown a schematic representation of a current sensing circuit 96 usable in the current probe 16 of the current probing system 10. The current sensing circuit 96 has a ring-shaped core 120 of magnetic material defining an aperture. The current carrying conductor 14 is coupled via the first and second electrically conductive contacts 94 and 95 of the current probe 16 to a primary winding 122 that is coupled in series with the current carrying conductor 14. The current carrying conductor 14 is coupled in a flux linking relationship with ring-shaped magnetic core 120 via the primary winding 122. The current to be measured in the current carrying conductor 14 produces a magnetic flux in the magnetic core 122 and is linked to a secondary winding 124. One terminal of the secondary winding 124 is coupled to ground with the other terminal being coupled to the inverting input terminal of a transimpedance amplifier 126. The inverting input terminal of the transimpedance amplifier 126 is coupled to the output terminal of the amplifier 126 via a current signal path 128 having a transimpedance resistor 130. Thus the primary winding 122, the magnetic core 120 and the secondary winding 124 function as a transformer 132. A magneto-electric converter 134 is disposed within the magnetic core 120 substantially perpendicular to the lines of flux in the magnetic core 120. The magneto-electric converter 134 is preferably a thin film semiconductor Hall effect device having a first pair of terminals coupled to a bias source 136 and a second pair of terminals connected to differential inputs of amplifier 138. The amplifier 138 is preferably a high gain differential amplifier having low noise and high common mode rejection The single ended output of the differential amplifier 138 is coupled to the non-inverting input of the transimpedance amplifier 126. Offset control signals resulting from the degaussing of the current sensing circuit may also be applied to the differential amplifier 138 via an offset voltage line 140.

The current in the primary winding 122 produces a magnetic flux in the magnetic core 120 of the transformer 132 that is linked to the secondary winding 124 and the Hall effect device 134. DC or low frequency components of the current flowing the in the primary winding 122 generate a potential difference between the second pair of terminals of the Hall effect device 134. The voltage output of the Hall effect device 134 is coupled to the differential inputs of the amplifier 138. The output of amplifier 138 is coupled to the non-inverting input of the transimpedance amplifier 126. The changing signal level on the non-inverting input of the transimpedance amplifier 126 caused by the voltage generated by the Hall effect device 134 produces a corresponding change in the output voltage level of the transimpedance amplifier 126. The voltage at the output of the transimpedance amplifier 126 results in a current being generated in the current signal path 128 that is coupled to the secondary winding 124 of the transformer 132. The current flowing in the secondary winding 124 is opposite the current flowing in the primary winding 122 producing a magnetic flux in the magnetic core 120 that nulls the magnetic flux produced by the current flowing in the primary winding 122. This DC to low frequency feedback loop maintains an opposing current through the current signal path 128 that is equal to the DC or low current signal in the primary winding 122 of the transformer 132.

The high frequency components of the current flowing in the primary winding 122 results in a current being induced in the secondary winding 124 in a direction such as to produce a magnetic field in the magnetic core 120 that is opposite to the field created by the current in the primary winding 122. The current induced in the secondary winding 124 is coupled to the inverting input of the transimpedance amplifier 126. Since the inverting input is a virtual ground, the current in the secondary winding 124 is coupled via the current signal path 128 through the transimpedance resistor 130 to the output of the transimpedance amplifier 126 resulting in an amplified voltage output representative of the high frequency components of the current flowing in the primary winding 122. The transimpedance amplifier 126 functions as both a power amplifier for generating a bucking current for nulling the magnetic flux in the magnetic core 120 at DC to low current frequencies and as a transimpedance amplifier for higher frequencies. The output of the transimpedance amplifier 126 is to the oscilloscope 12 via the conductive cable 28.

Figure 7:
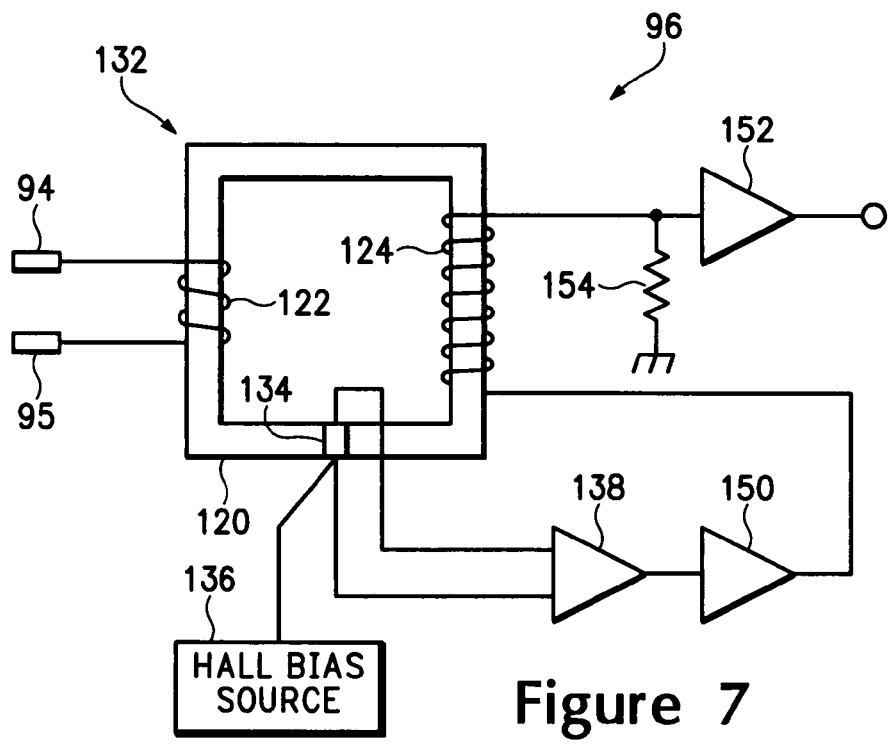
FIG. 7 is a schematic representation of another current sensing circuit in the current probing system.

FIG. 7 is a schematic representation of another current sensing circuit 96. Like elements from the previously are labeled the same in FIG. 7. The current sensing circuit 96 has a ring-shaped core 120 of magnetic material defining an aperture. The current carrying conductor 14 is coupled via the first and second electrically conductive contacts 94 and 95 of the current probe 16 to a primary winding 122 that is coupled in series with the current carrying conductor 14. The current carrying conductor 14 is coupled in a flux linking relationship with ring-shaped magnetic core 120 via the primary winding 122. The current to be measured in the current carrying conductor 14 produces a magnetic flux in the magnetic core 122 and is linked to a secondary winding 124. Thus the primary winding 122, the magnetic core 120 and the secondary winding 124 function as a transformer 132. A magneto-electric converter 134 is disposed within the magnetic core 120 substantially perpendicular to the lines of flux in the magnetic core 120. The magneto-electric converter 134 is preferably a thin film semiconductor Hall effect device having a first pair of terminals coupled between a bias source 136 and ground and a second pair of terminals connected to differential inputs of amplifier 138. The amplifier 138 is preferably a high gain differential amplifier having low noise and high common mode rejection. The single ended output of the differential amplifier 138 is coupled to a power amplifier 150 whose output is coupled to one end of the secondary winding 124. The other end of the secondary winding 124 is coupled to the input of a voltage gain amplifier 152 via a transformer termination resistor 154 summing node.

The current in the primary winding 122 produces a magnetic flux in the magnetic core 120 of the transformer 132 that is linked to the secondary winding 124 and the Hall effect device 134. DC or low frequency components of the current flowing the in the primary winding 122 generate a potential difference between the second pair of terminals of the Hall effect device 134. The voltage output of the Hall effect device 134 is coupled to the differential amplifier 138 whose output is coupled to the power amplifier 150. The power amplifier 150 generates a current output that is coupled to the secondary winding 124. The current flowing in the secondary winding 124 from the power amplifier 150 is opposite the current flowing in the primary winding 122 producing a magnetic flux in the magnetic core 120 that nulls the magnetic flux produced by the current flowing in the primary winding 122. This opposing current through secondary winding representing the DC or low current signal in the primary winding 122 of the transformer 132 and is coupled to the input of the voltage gain amplifier 152 via the transformer termination resistor 154 summing node.

The high frequency components of the current flowing in the primary winding 122 results in a current being induced in the secondary winding 124 in a direction such as to produce a magnetic field in the magnetic core 120 that is opposite to the field created by the current in the primary winding 122. The current induced in the secondary winding 124 is coupled to the input of voltage gain amplifier 152 via transformer termination resistor 154 summing node. The current flowing in the secondary winding 124 from the power amplifier 150 nulls the magnetic flux in the magnetic core 120 for DC to low frequency current signals. The current induced in the secondary winding 124 by the current flowing in the primary winding 122 nulls the magnetic flux in the magnetic core 120 for high frequency current signals.

The transition range between the current flowing in the secondary winding 124 from the power amplifier 150 and the current induced into the secondary winding 124 at higher frequencies results in the currents from both sources being summed at the transformer termination resistor 154 summing node. The voltage output of the voltage gain amplifier 152 is coupled to the oscilloscope 12 via the conductive cable 28.

Figure 8:
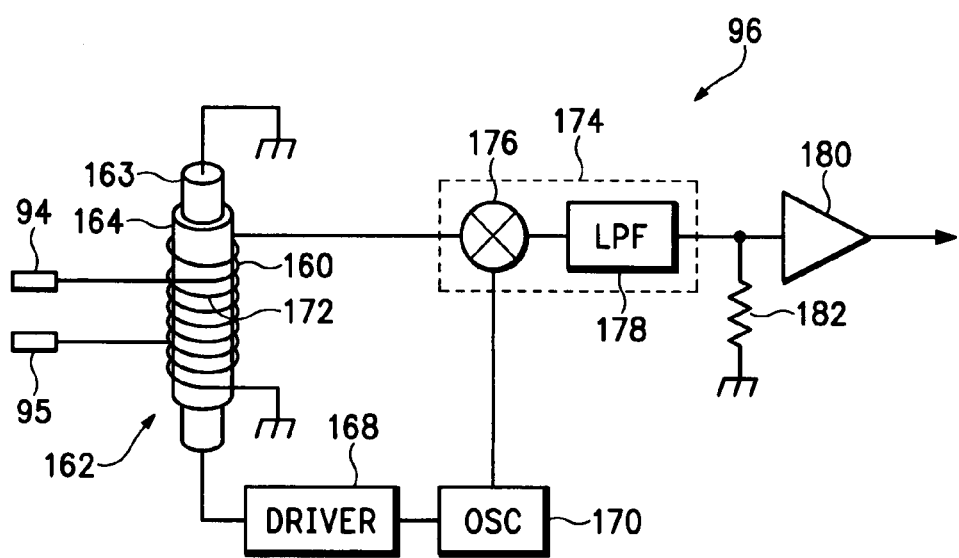
FIG. 8 is a schematic representation of a further current sensing circuit in the current probing system.

FIG. 8 is a schematic drawing of a further current sensing circuit 96. The current carrying conductor 14 is coupled via the first and second electrically conductive contacts 94 and 95 of the current probe 16 to an input winding 160 of a flux gate 162 that is coupled in series with the current carrying conductor 14. The flux gate 162 has a cylindrical magnetic core 164 around which the input winding 160 is wrapped. A conductive bar 166 is disposed coaxially through the cylindrical magnetic core 164 and is coupled to a driver circuit 168 coupled to an oscillator 170. A detecting coil 172 is placed around the cylindrical magnetic core 164 for detecting the magnetic flux of the current signal on the input winding and the magnetic flux of a signal from the oscillator 170. The detecting coil 172 is coupled to a detection circuit 174 having a mixer 176 that receives a signal from the oscillator 170 that is twice the frequency of the signal applied to the conductive bar 166. The mixer 176 is coupled to a low pass filter (LPF) 178 which in turn is coupled to an output amplifier 180 via a termination resistor 182.

The driver circuit 168 generates an oscillating drive current that causes the magnetic core 164 to saturate at the peaks of the drive current signal so that the magnetic flux leaves the magnetic core 164 and is aligned with the conductive bar 166. During these periods, the degree of magnetization of the core 164 in the longitudinal direction is decreasing. As the driving current approaches the zero crossing points, the magnetic flux again passes through the magnetic core 164. During these periods, the degree of magnetization of the core 164 in the longitudinal direction is increasing. The direction and density of the magnetic flux in the magnetic core changes according to the changes in the driving current. The voltage output induced into the detecting coil 172 with the current drive signal applied to the flux gate 162 has two cycles for each cycle of the drive current. A current signal applied to the input winding 160 modulates the magnetic flux in the magnetic core producing a modulated voltage output at detecting coil 172 representative of the current signal on the input winding. The modulated output voltage on the detecting coil 172 is coupled to the mixer 176. The mixer 176 multiplies the modulated output voltage with the oscillator signal that is twice the frequency of the drive current. The low pass filter 178 filters the output of the mixer to provide a voltage proportional to the current flowing the input winding 160. The output amplifier 180 receive the filter signal and generates an amplified voltage output. The above described current sensing circuits are by example only and modifications to the above circuits may be made without departing from the scope of the invention.

A current probing system had been described having a current probe and a detachable adapter. The current probe has a probe body and electrically conductive contacts that mate with electrically conductive contacts on the adapter. Leads extend from the adapter for coupling to a current carrying conductor. The leads can connect to a plug that is coupled to a current diverting device for coupling a current signal to the current probe. The adapter may also include a switch that selectively couples the current signal to the current probe when the adapter is mated with the current probe. The contacts of the current probe are coupled to a current sensing circuit which generates a voltage output representative of the current signal. The voltage output is coupled to an oscilloscope via an electrical cable.

It will be obvious to those having skill in the art that many changes may be made to the details of the above-described embodiments of this invention without departing from the underlying principles thereof. The scope of the present invention should, therefore, be determined only by the following claims.

What is claimed is:

1. A current probing system for use with an oscilloscope for acquiring a current signal from a current carrying conductor disposed on a device under test comprising:
   a current probe having a probe body and first and second electrically conductive contacts disposed in one end of the probe body with the first and second electrically conductive contacts adapted for coupling in series with the current carrying conductor disposed on the device under test;
   a current sensing circuit disposed in the probe body and coupled to the first and second electrically conductive contacts for generating an output signal representative of the current flowing in the current carrying conductor disposed on the device under test; and
   an electrically conductive cable extending from the other end of the probe body coupled to receive the output signal from the current sensing device and for coupling to the oscilloscope; and
   an adapter having a housing adapted for mounting on the probe body having first and second electrically conductive leads extending from the housing with each of the first and second electrically conductive leads having a first electrical contact for coupling to the current carrying conductor disposed on the device under test and a second electrical contact disposed within the housing for coupling with one of the first and second electrically conductive contacts of the current probe.

2. The current probing system as recited in claim 1 wherein the first electrical contacts of the first and second electrically conductive leads are coupled to a plug adapted for engaging electrically conductive contacts acting as switch elements in a current diverting device electrically coupled to the current carrying conductor disposed on the device under test wherein the current diverting device couples the current signal through the current carrying conductor in a first position and couples the current signal through the current probe in a second position resulting from downward pressure of the plug on at least one of the electrically conductive contacts of the current diverting device causing the electrically conductive contacts of the current diverting device to disengage in a second current diverting device position.

3. The current probing system as recited in claim 1 wherein the adapter further comprises a switch disposed within the adapter housing having a first terminal electrically coupled to one of the second electrical contacts of the first and second electrically conductive leads and selectively coupled to one of the first and second electrically conductive contacts of the current probe and a second terminal coupled to the other of the second electrical contacts of the first and second electrically conductive leads and selectively coupled to the other of the first and second electrically conductive contacts of the current probe and a armature for selectively coupling the first and second terminals together, wherein the switch has a first switch position wherein the armature electrically couples the first and second electrically conductive leads together when the adapter housing is separated from the probe body and a second switch position wherein the armature de-couples the first and second electrically conductive leads from each other when the adapter housing is mounted on the probe body, the first and second electrically conductive contacts of the current probe being electrically coupled to the first and second terminals of the switch when the adapter housing is mounted on the probe body.

4. The current probing system as recited in claim 3 wherein the current carrying conductor disposed on the device under test has square pins mounted thereon on either side of a non-conductive gap in the current carrying conductor and each of the first electrical contacts of the first and second electrically conductive leads further comprises an electrically conductive sockets having a bore therein for mating with the square pin connectors mounted on the current carrying conductor.

5. The current probing system as recited in claim 3 wherein the current carrying conductor disposed on the device under test has a non-conductive gap therein and each of the first electrical contacts of the first and second electrically conductive leads further comprises a contact pad connected to each of the first and second electrically conductive leads and fixedly secured to the current carrying conductor on either side of the non-conductive gap.

6. The current probing system as recited in claim 3 wherein the adapter further comprising first and second voltage clamps disposed between the first and second terminals of the switch for minimizing arcing across the contact terminal caused by inducive kick-back.

7. The current probing system as recited in claim 6 wherein the voltage clamps comprises diodes.

8. The current probing system as recited in claim 1 wherein the electrically conductive contacts disposed in the probe body are formed from an array of contact disposed in a receptacle with a first portion of the array of contacts electrically coupled together to form the first electrically conductive contact in the probe body and a second portion of the array of contacts coupled together to form the second electrically conductive contact in the probe body and the first and second electrically conductive contacts disposed in the adapter housing further comprise an array of contact disposed in a receptacle with a first portion of the array of contacts electrically coupled together to form the first electrically conductive contact and a second portion of the array of contacts coupled together to form the second electrically conductive contacts, the receptacles in the probe body and adapter housing mating for coupling the first and second electrically conductive contacts in the probe body with the first and second electrically conductive contacts in the adapter housing.

9. The current probing system as recited in claim 1 wherein the current sensing circuit further comprises a magnetic sensor coupled to the first and second electrically conductive contacts for sensing the magnetic flux of the current signal and coupled to amplifier circuitry for generating the output signal representative of the current flowing in the current carrying conductor disposed on the device under test.

10. The current probing system as recited in claim 9 wherein the magnetic sensor further comprises a transformer having primary and secondary windings and a magnetic core with the primary winding coupled to the first and second electrically conductive contacts for receiving the current signal from the current carry conductor disposed on the device under test and inducing a magnetic flux within the magnetic core and the secondary winding for generating a current signal output in the secondary winding that is coupled to amplifier circuitry.

11. The current probing system as recited in claim 10 wherein the magnetic core of the transformer is ring-shaped and defines an aperture with primary winding disposed around a portion of the ring-shaped magnetic core of the transformer.

12. The current probing system as recited in claim 10 wherein the transformer further comprises a magneto-electric converter disposed in the magnetic core of the transformer and interacting with the magnetic flux within the magnetic core for generating a voltage signal representative of DC to low frequency current signals on the current carrying conductor disposed on the device under test with the voltage signal being coupled to the amplifier circuitry.

13. The current probing system as recited in claim 9 wherein the magnetic sensor further comprises a flux gate.

* * * * *